United States Patent
Duhl et al.

[11] Patent Number: 4,719,080
[45] Date of Patent: Jan. 12, 1988

[54] ADVANCED HIGH STRENGTH SINGLE CRYSTAL SUPERALLOY COMPOSITIONS

[75] Inventors: David N. Duhl, Newington; Alan D. Cetel, West Hartford, both of Conn.

[73] Assignee: United Technologies Corporation, Hartford, Conn.

[21] Appl. No.: 743,138

[22] Filed: Jun. 10, 1985

[51] Int. Cl.$^4$ ............................................. C22C 19/05
[52] U.S. Cl. ................................... 420/443; 148/404; 420/444; 420/445; 420/448
[58] Field of Search ............... 420/443, 444, 445, 448; 148/404, 410, 428

[56] References Cited

U.S. PATENT DOCUMENTS

| | | | |
|---|---|---|---|
| 4,222,794 | 9/1980 | Schweizer et al. | 148/404 |
| 4,402,772 | 9/1983 | Duhl et al. | 148/404 |
| 4,639,280 | 1/1987 | Fredholm et al. | 148/404 |

FOREIGN PATENT DOCUMENTS 0155827  9/1985  European Pat. Off. .

Primary Examiner—R. Dean
Attorney, Agent, or Firm—Charles E. Sohl

[57] ABSTRACT

A superalloy composition and single crystal articles of the composition are described. The broad range is 3-12% Cr, 0-3% Mo, 3-10% W, 0-5% Re, 6-12% Ta, 4-7% Al, 0-15% Co, 0-0.045% C, 0-0.02% B, 0-0.1% Zr, 0-0.8% Hf, 0-2% Nb, 0-1% V, 0-0.7% Ti, 0-10% (Ru+Rh+Pd+Os+Ir+Pt), balance essentially Ni. An equation is presented to select the most useful specific compositions from within this range. An exemplary preferred composition is 5.0% Cr, 10.0% Co, 2.0% Mo, 6.0% W, 3.1% Re, 5.6% Al, 9.0% Ta, 0.1% Hf, balance essentially Ni.

16 Claims, 7 Drawing Figures

ADVANCED HIGH STRENGTH SINGLE CRYSTAL SUPERALLOY COMPOSITIONS

TECHNICAL FIELD

This invention relates to the field of nickel base superalloy compositions adapted to be used in cast single crystal form and to single crystal articles.

BACKGROUND ART

Nickel base superalloys are widely used in applications where high stresses must be endured at elevated temperatures. One such application is the field of gas turbine engines where nickel base superalloys are widely used especially for blades and vanes. Demands for improved efficiency and performance have resulted in the operation of turbine engines at increasingly elevated temperatures placing extreme demands on the superalloy articles used therein.

One approach which has been successfully employed to improve the temperature capabilities of nickel base alloys is to fabricate them in the form of single crystals. Conventionally prepared metallic materials are comprised of a plurality of grains which are separated by grain boundaries. The grain boundaries are weak at elevated temperatures, much weaker than the material within the grains. Through specific casting techniques nickel base superalloys can be produced in single crystal form, that is, in the form of articles which have no internal grain boundaries. U.S. Pat. No. 3,260,505 describes nickel base single crystal superalloy articles. U.S. Pat. No. 4,116,723 describes a heat treatment method applicable to a class of nickel single crystal articles. U.S. Pat. No. 4,209,348 describes a more specific class of single crystal articles and describes a method for heat treating such articles to improve their elevated temperature mechanical properties. The nominal composition disclosed in this patent is 10% chromium, 5% aluminum, 1.5% titanium, 4% tungsten, 12% tantalum, 5% cobalt, balance essentially nickel. Single crystals of this composition are used commercially in gas turbine engine applications. This composition is generally acknowledged to have the best overall combination of properties attainable in a cast nickel base superalloy article. Another single crystal superalloy composition is that which is described in U.S. Pat. No. 4,402,772 having a nominal composition of 6% tantalum, 9% chromium, 5% cobalt, 1% titanium, 1% molybdenum, 7% tungsten, 5.5% aluminum, 0.15% hafnium, balance essentially nickel. This material also has desirable properties which are essentially equivalent to those of the properties in the U.S. Pat. No. 4,209,348 material. Yet another composition is that described in U.S. Pat. No. 4,222,794 having a nominal composition of 5.2% chromium, 5.4% aluminum, 1.1% titanium, 2% molybdenum, 4.9% tungsten, 6.4% tantalum, 3% rhenium, 0.4% vanadium, balance essentially nickel.

DISCLOSURE OF INVENTION

The present invention comprises a nickel base superalloy composition which can be fabricated into single crystal articles having an exceptional combination of properties. The broad composition range is 3-12% chromium, up to 3% molybdenum, 3-10% tungsten, 0-5% rhenium, 6-12% tantalum, 4-7% aluminum, 0-15% cobalt, up to 0.045% carbon, up to 0.02% boron, up to 0.1% zirconium, up to 0.8% hafnium, up to 2% niobium, up to 1% vanadium, up to 0.7% titanium, up to 10% of one or more elements selected from the group consisting of platinum, palladium, ruthenium, rhodium, iridium and osmium, up to 0.1% yttrium, lanthanum, scandium, cerium, lanthanide or actinide series of elements, balance essentially nickel. An exemplary and preferred specific composition within this broad composition range is 5% chromium, 2% molybdenum, 6% tungsten, 3% rhenium, 9% tantalum, 5.6% aluminum, 10% cobalt, 0.1% hafnium, balance essentially nickel. A compositional relationship is described which can guide one skilled in the art to the selection of an optimum composition within the broad range.

Other features and advantages will be apparent from the specification and claims and from the accompanying drawings which illustrate an embodiment of the invention.

BEST MODE FOR CARRYING OUT THE INVENTION

Table I lists several composition ranges of varying scope for the composition of the single crystals of the present invention. All percent figures in this application are weight percent figures unless otherwise indicated.

Nickel base superalloys such as the invention composition are developed with certain requirements in mind. Among these are oxidation resistance, corrosion resistance and mechanical properties.

Resistance to oxidation and corrosion is largely determined by the nature of the oxide layer which forms on the alloy. In the invention composition the chromium and aluminum act together to insure the formation of a protective oxide layer. The layer contains substantial amounts of alumina but the alumina may be mixed with other oxides depending upon the test conditions. If excessive amounts of chromium are present, undesirable phases form unless other strengthening elements are reduced. In addition to providing oxidation and corrosion resistance the aluminum is the primary gamma prime former. The gamma prime phase, $Ni_3Al$, is the phase which provides most of the strength of nickel base superalloys. In addition to aluminum as a gamma prime former the present alloy contains tantalum which is also a strong gamma prime former. These elements are present in a sufficient amount to form from about 50 to about 75% by volume of a gamma prime strengthening phase. When present, platinum, palladium, ruthenium and osmium are also effective in increasing the oxidation and corrosion resistance of the material. In many superalloys titanium and/or vanadium are used as gamma prime formers. In the present alloy, however, it is not desirable to employ titanium or vanadium as gamma prime formers since the utilization of titanium or vanadium for this purpose will limit the amount of aluminum which can be used as a gamma prime former and will thereby effectively reduce the oxidation resistance of the material.

The refractory elements, molybdenum, tungsten and rhenium, are present to act as solid solution strengtheners and these elements primarily improve the properties of the gamma matrix.

The invention composition will be cast in single crystal form according to the teachings of various prior art patents including U.S. Pat. Nos. 3,700,023; 3,763,926 and 4,190,094 which are incorporated herein by reference.

The compositions and single crystal articles of the present invention will preferably be given a heat treatment in accordance with the teachings of U.S. Pat. No. 4,116,723. For alloy B49 (described in Table I), the most promising alloy yet identified within the scope of the present invention, the preferred heat treatment is a solution treatment for four hours at a temperature between about 2375°–2405° F. followed by rapid air cooling to ambient, then a heat treatment at 1975° F. for four hours. This second heat treatment will be usually performed in conjunction with a coating cycle such as pack aluminide coating or overlay coating. The final (optional) step is a heat treatment at about 1300° F. for about twenty-four hours.

Within the broad ranges presented in Table I a particular relationship should be obeyed to obtain optimum properties. This relationship is set forth below:

$$P = -200\,Cr + 80\,Mo - 20\,Mo^2 - 250\,Ti^2 - 50\,(Ti \times Ta) + 15\,Cb + 200\,W - 14\,W^2 + 30\,Ta - 1.5\,Ta^2 + 2.5\,Co + 1200\,Al - 100\,Al^2 + 100\,Re + 1000\,Hf - 2000\,Hf^2 + 700\,Hf^3 - 2000\,V - 500\,C - 15000\,B - 500\,Zr$$

All values in this equation are weight percent values. The value P given by the equation is a parameter which predicts the overall merit of the composition. Compositions with high P values will have high strength in combination with stability, heat treatability and resistance to oxidation and corrosion.

While it is apparent that the composition ranges in Table I, particularly the broad composition range, may encompass specific compositions known in the art, so far as is known to the inventors, there are no prior art compositions whose P values exceed approximately 3360. Accordingly, a broad definition of the present invention is a composition, useful for use in single crystal form, lying within either the broad, intermediate or preferred ranges of Table I having a P value (as defined above) in excess of 3360. The invention also concerns single crystal articles within the composition range having a P value in excess of about 3360. For an optimum alloy, the most useful composition currently known to the inventors, the value of P will be slightly in excess of 3940.

TABLE I

| | (Weight Percent) | | |
|---|---|---|---|
| | Broad | Intermediate | Preferred |
| Cr | 3–12 | 3–8 | 4.0–7.5 |
| Mo | 0–3 | 0.3–3.0 | 0.5–2.5 |
| W | 3–10 | 3–8 | 3.5–7.5 |
| Re | 0–5 | 0–5.0 | 2.5–4 |
| Ta | 6–12 | 6–12 | 8–10 |
| Al | 4–7 | 4.5–6.5 | 5–6 |
| Co | 0–15 | 6–12 | 8–12 |
| B | 0–0.02 | 0–0.005 | * |
| Zr | 0–0.1 | 0–0.007 | * |
| C | 0–0.045 | 0–0.02 | * |
| Hf | 0–0.8 | 0–0.5 | 0.1–0.5 |
| Cb | 0–2 | — | — |
| V | 0–1 | — | — |
| Ti | 0–0.7 | 0–0.4 | — |
| (Ru, Ir, Pt, Pd, Rh, Os) | 0–10 | 0–10 | 0–10 |
| (Y, La, Sc, Ce, Lanthanides or Actinides) | 0–0.1 | 0–0.1 | .005–.054 |
| Ni | Bal | Bal | Bal |

*No intentional addition.

Other prior art patents relating to single crystals include U.S. Pat. No. 4,402,772 for which the maximum P value is 2998; U.S. Pat. No. 4,222,794 for which the maximum P value is 3329 and U.S. Pat. No. 4,371,404 for which the maximum P value is 3003.

Table II contains broad, intermediate and preferred P values for the broad, intermediate and preferred composition range of Table I.

TABLE II

| | P Values | | |
|---|---|---|---|
| Table I Ranges | Broad | Intermediate | Preferred |
| Broad | 3360–4850 | 3475–4750 | 3650–4600 |
| Intermediate | 3450–4750 | 3550–4650 | 3700–4500 |
| Preferred | 3550–4700 | 3650–4550 | 3800–4400 |

Table III sets forth a series of example compositions which were evaluated in single crystal form. In Table III alloys B1, B10 and B13 lie outside of the broad range of the present invention by virtue of their low tantalum levels. Alloy B35 lies outside the preferred range because it lacks molybdenum.

Table IV sets forth some of the more significant properties of the single crystal compositions described in Table III. Also shown in Table III are the P values derived from the previously described equation for the example compositions set forth in Table III. Alloy B49 is seen to have the highest P value and an exceptional combination of properties and is a particularly preferred composition. Data in Table IV also illustrates the detrimental effect on oxidation behavior which results from additions of titanium to alloys similar to those of the present invention. Alloy B10 and alloy B13 are similar except that alloy B10 contains 1% titanium; likewise alloys B1 and B18 are similar except that alloy B1 contains 1% titanium. In coated oxidation resistance, the titanium containing compositions, B1 and B10, can be seen to have oxidation temperature capabilities which are 70° F. and 90° F. less than the titanium free B18 and B13 compositions. In uncoated oxidation behavior the B1 and B10 compositions show a 40° F. and 20° F. disadvantage relative to the B18 and B13 compositions

TABLE III

| Alloy | Cr | Co | Mo | W | Re | Al | Ta | Hf | Ni | Other | P |
|---|---|---|---|---|---|---|---|---|---|---|---|
| | | | | (weight percent) | | | | | | | |
| B1* | 7.9 | 5.0 | 2.0 | 6.9 | 0 | 5.4 | 5.9 | .1 | Balance | 1.0 Ti | 2468 |
| B10* | 7.5 | 10.0 | 2.0 | 4.9 | 2.9 | 5.5 | 3.9 | .1 | Balance | 1.0 Ti | 2862 |
| B13* | 7.1 | 9.9 | 2.0 | 6.9 | 2.9 | 5.8 | 3.9 | .1 | Balance | | 3478 |
| B18 | 7.0 | 10.0 | 2.0 | 6.0 | 3.0 | 5.5 | 6.9 | .1 | Balance | | 3510 |
| B21 | 7.1 | 10.0 | 2.1 | 7.0 | 3.0 | 5.4 | 6.2 | .1 | Balance | | 3490 |
| B22 | 7.0 | 10.0 | 1.0 | 8.1 | 3.1 | 5.5 | 6.1 | .1 | Balance | | 3498 |
| B35* | 7.0 | 10.0 | 0 | 3.5 | 4.0 | 5.5 | 10.9 | .1 | Balance | | 3376 |
| B46 | 6.8 | 10.0 | 1.0 | 3.8 | 5.1 | 5.5 | 7.4 | .1 | Balance | | 3607 |
| B48 | 5.0 | 10.0 | 2.0 | 4.0 | 3.1 | 5.6 | 10.9 | .1 | Balance | | 3823 |
| B49 | 5.0 | 10.0 | 2.0 | 6.0 | 3.1 | 5.6 | 9.0 | .1 | Balance | | 3943 |
| Prior art** | 10.0 | 5.0 | 0 | 4.0 | 0 | 5.0 | 12.0 | 0 | Balance | 1.5 Ti | 770 |

*Outside of Preferred Range
**U.S. Pat No. 4,209,348

TABLE IV

| | | 1800 F/36 ksi Creep-Rupture (hrs) | | Temperature Advantage Over Prior Art* (°F.) | | | |
|---|---|---|---|---|---|---|---|
| | | | | Creep-Rupture | | Oxidation | |
| Alloy | Hot Corrosion Resistance* | Time 1% Creep | Rupture Life | Time to 1% Creep | Rupture Life | PWA 286 Coated | Uncoated |
| B1 | — | 45.0 | 107.5 | 11.0 | 9.0 | −10 | 25 |
| B10 | — | 51.5 | 164.7 | 17.5 | 29.0 | −35 | 25 |
| B13 | — | 86.3 | 219.6 | 46.0 | 43.0 | 55 | 45 |
| B18 | .9X | 78.8 | 271.5 | 43.5 | 53.5 | 60 | 65 |
| B21 | — | 109.8 | 299.2 | 58.0 | 58.0 | — | 55 |
| B22 | — | 82.6 | 273.8 | 45.5 | 54.0 | 60 | 75 |
| B35 | — | 76.9 | 272.9 | 42.5 | 54.0 | 85 | — |
| B46 | 1.3 | 113.0 | 276.7 | 59.5 | 54.5 | — | 80 |
| B48 | .7 | 129.7 | 319.6 | 65.5 | 61.0 | — | 90 |
| B49 | .9 | 182.8 | 406.8 | 80.5 | 71.0 | 65 | 70 |

*Relative to U.S. Pat. No. 4,209,348 composition

Figure 1A:
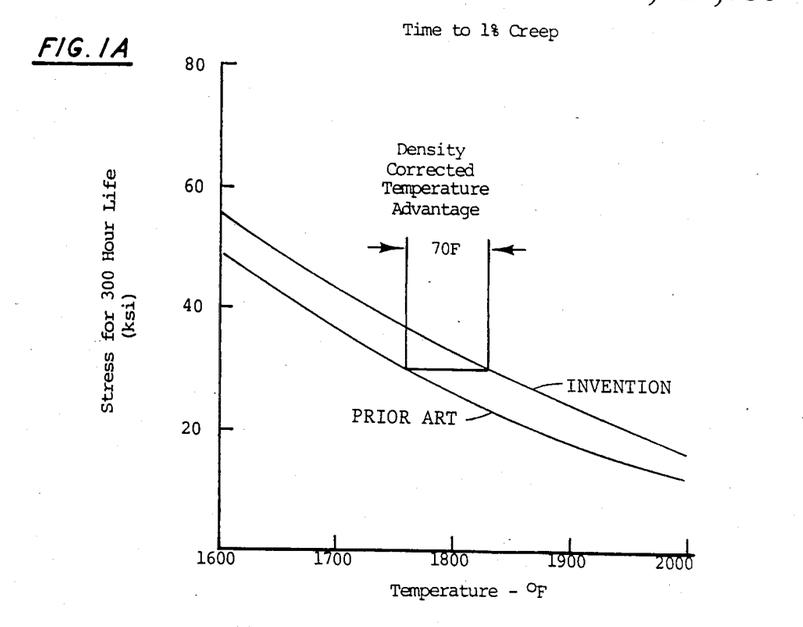
FIG. 1A is a graph which illustrates the stress as a function of temperature for the invention material and a prior art material.
Figure 1B:
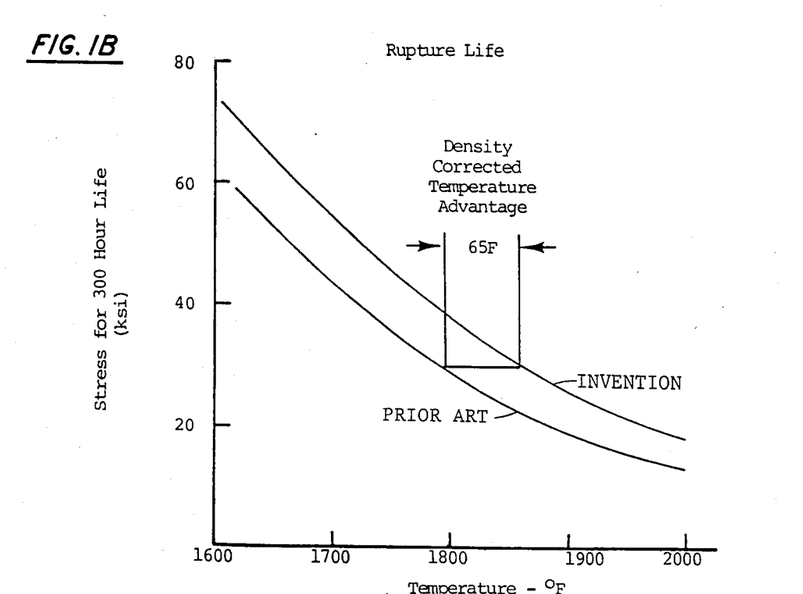
FIG. 1B is a graph which shows the stress required to produce rupture in 300 hours as a function of temperature for the invention material and a prior art material.

The properties of Alloy B49 will be contrasted with the properties of the alloy described in U.S. Pat. No. 4,209,348. This prior art composition (nominally 10 Cr, 5 Co, 4 W, 1.5 Ti, 12 Ta, 5 Al, Bal. Ni) is regarded as being among the best of the (prior art) single crystal alloys in terms of overall properties. FIGS. 1A and 1B show, respectively, the stress required to produce 1% creep and rupture in 300 hours as a function of temperature. In FIG. 1A it can be seen that the invention alloy has a 70° F. temperature advantage on a density corrected basis over the prior art composition, whereas in FIG. 1B it can be seen that in rupture life the invention composition has a temperature advantage of about 65° F. on a density corrected basis over the prior art composition. This means that in an application where rupture life or creep was the controlling factor, the invention alloy could be used at a temperature about 65° F., or 70° F. greater than the prior art alloy while obtaining equivalent life. This improved temperature capability can be exploited in various ways. Operation at an increased temperature can produce increased thrust or efficiency. Operating at a lesser temperature will increase operating life.

Figure 2:
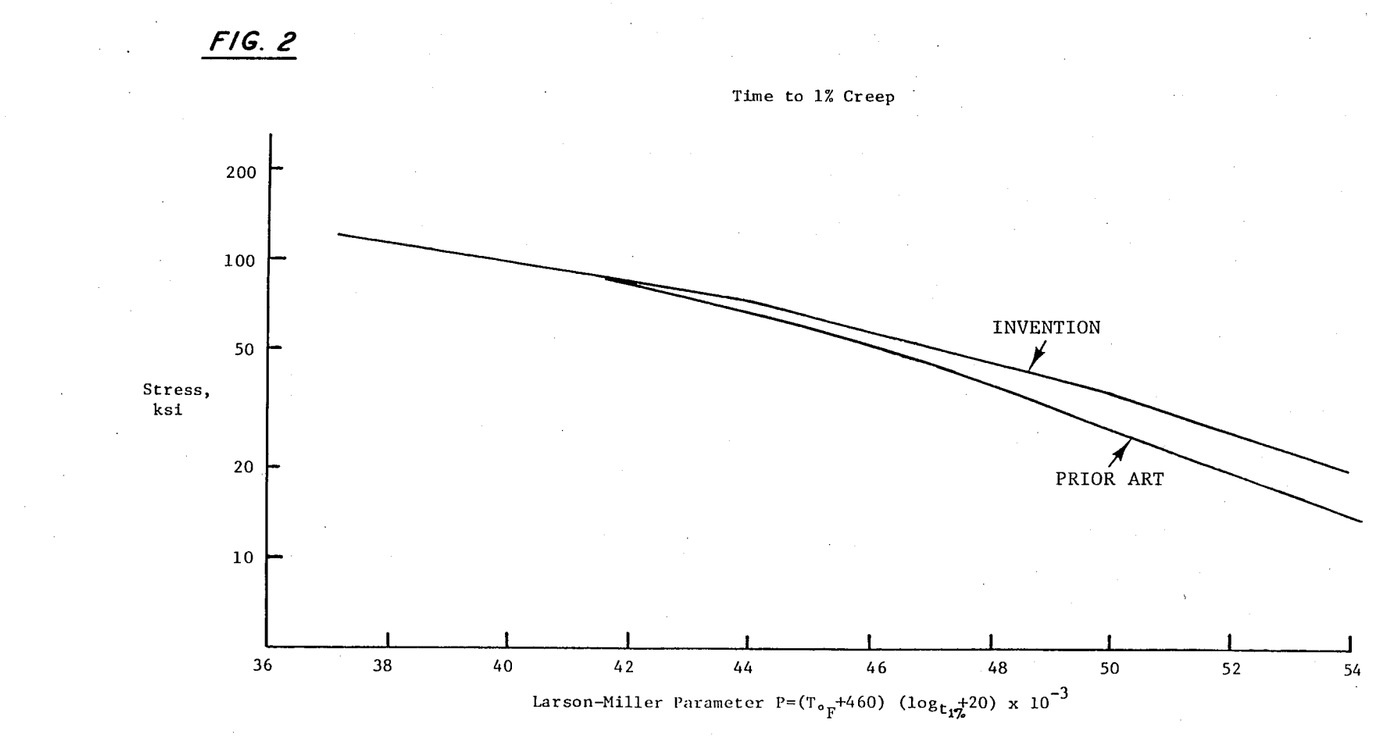
FIG. 2 is a Larson-Miller plot of the time to 1% creep compared to a prior art material.
Figure 3:
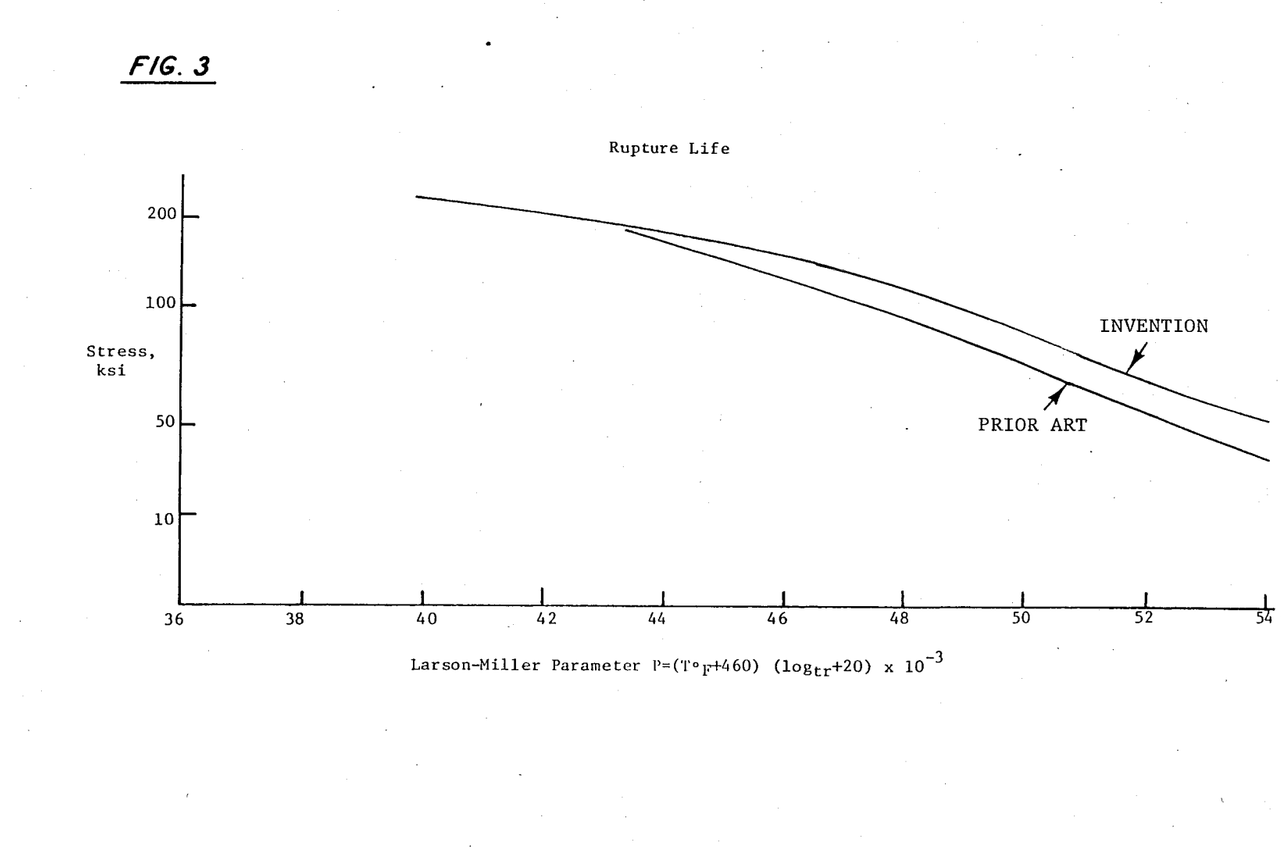
FIG. 3 is a Larson-Miller plot of the time to rupture compared to a prior art material.

FIG. 2 shows a plot of the stress required to produce 1% creep as a function of the Larson-Miller parameter which combines time and temperature. It can be seen that the invention composition has an advantage over the prior art composition, an advantage which increases with increasing exposure times and/or higher temperatures. The same comments can be made with respect to FIG. 3 which shows the stress required to produce rupture as a function of the previously-mentioned Larson-Miller parameter.

Figure 4:
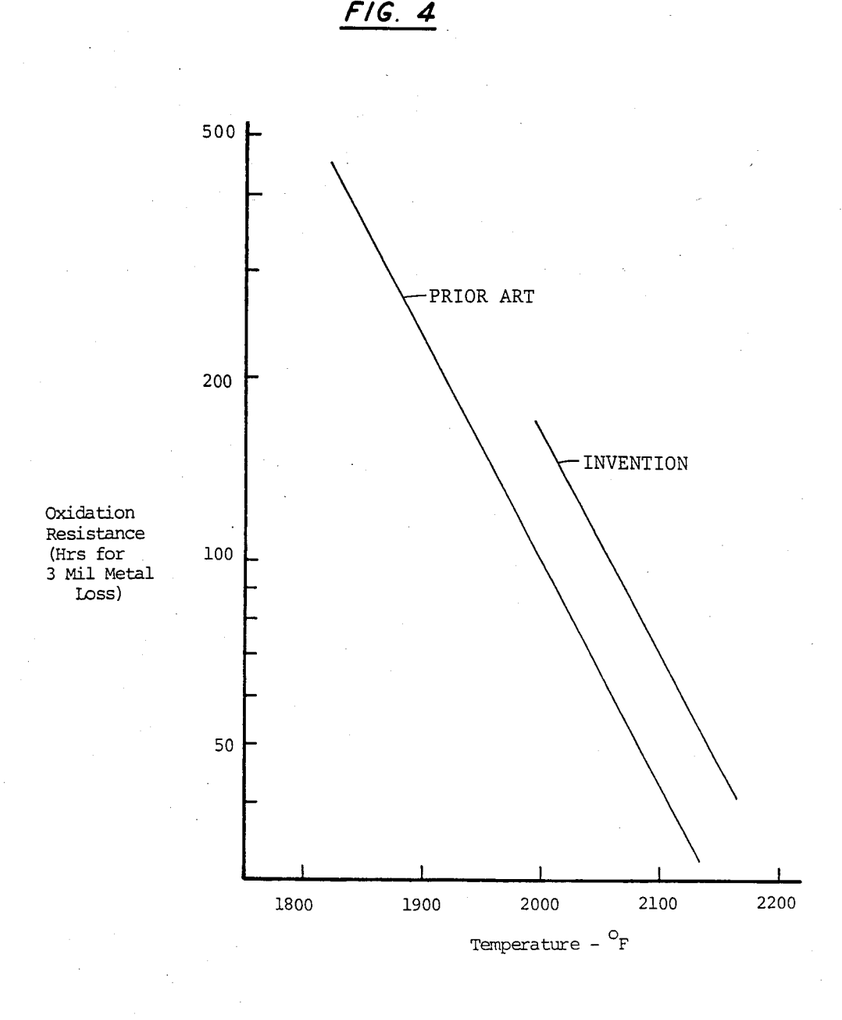
FIG. 4 is a chart comparing the oxidation behavior of the present invention with that of an exemplary prior art material.

FIG. 4 is a graph illustrating the oxidation behavior of the prior art composition and the present invention. The chart shows the hours required to produce a 3 mil deep oxidation attack on samples tested at different temperatures under cyclic conditions. The data on the chart was derived from a burner rig test in which samples were exposed to a high temperature flame, produced by the combustion of jet fuel, alternating with air cooling. This produces a severe environment which is representative of turbine engine operation. From FIG. 4 it can be seen that the present composition has a 65°–70° F. advantage over the prior art in terms of temperature at which an identical metal loss would be observed. Alternately, for a given temperature, i.e. 2100° F., the prior art composition would lose 3 mils of metal in about 43 hours whereas the invention compositin would lose that amount of material in 70 hours, a 63% improvement in oxidation life.

Figure 5:
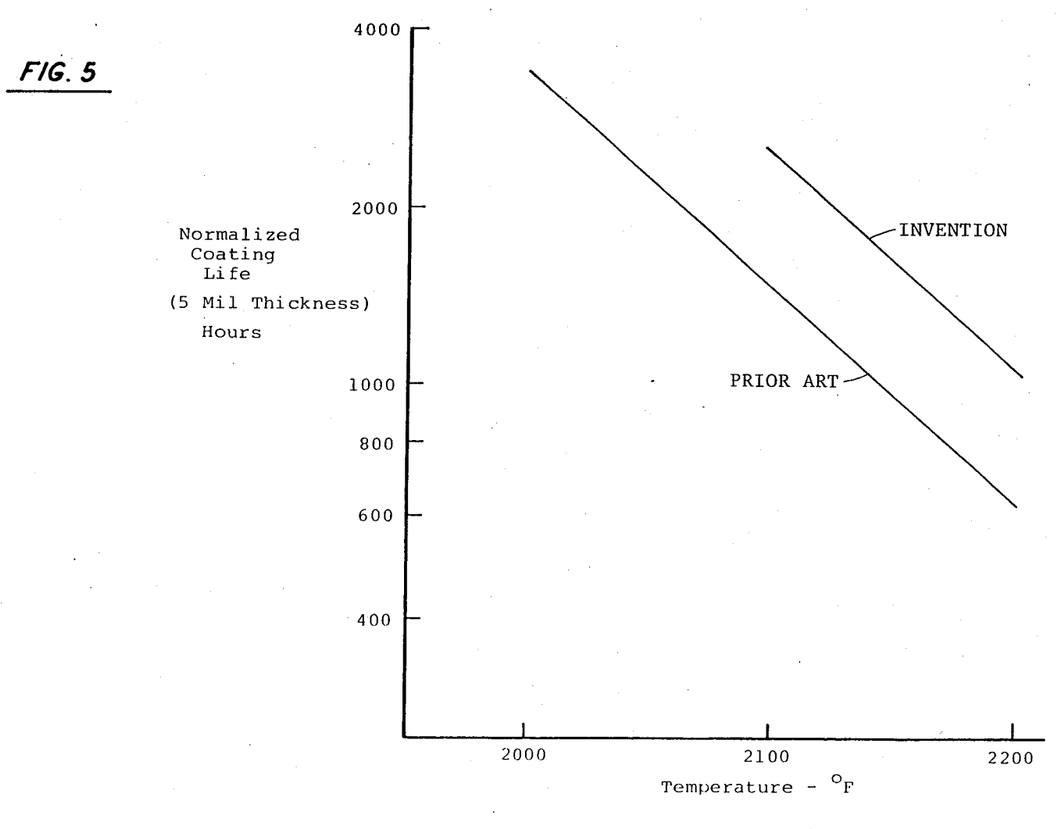
FIG. 5 is a plot showing the coated oxidation performance of the present invention compared with that of a prior art material.

FIG. 5 is similar to FIG. 4 except that the samples in FIG. 5 had received a 5 mil coating of an MCrAlY material whose nominal composition was 22 Co, 17 Cr, 12.5 Al, 0.25 Hf, 0.4 Si, 0.6 Y, balance Ni, prior to testing. The time shown in FIG. 5 is the time required for coating penetration. It can be seen that the present invention composition has about a 60° F. temperature advantage over the prior art. In terms of time to produce coating penetration at 2100° F. the invention composition requires about a 64% longer exposure time to produce coating defeat. At 2100° F., the prior art composition was penetrated in about 1400 hours, whereas the present invention composition required about 2300 hours for coating penetration. The benefits of the MCrAlY coating are apparent when one compares the 2300 hour figure with the life derived from FIG. 4 at 2100° F. for an uncoated sample of the present invention of about 70 hours for 3 mils of attack or less than 200 hours for 5 mils of attack.

Figure 6:
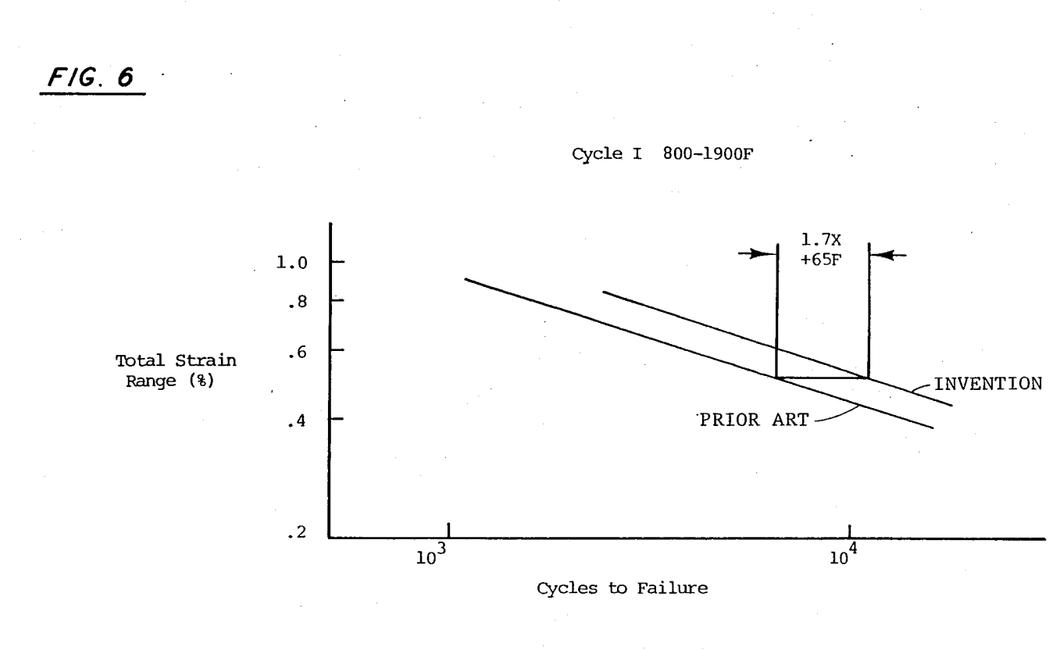
FIG. 6 is a plot illustrating the thermo-mechanical fatigue behavior of the invention material as contrasted with that of the prior art material.

The final figure, FIG. 6, illustrates the superiority of the present invention over the prior art composition in thermal fatigue. Thermal fatigue occurs as a result of stresses arising from cyclic nonuniform heating. FIG. 6 is a plot showing the total strain range undergone by the sample in each cycle as a function of the cycles required to produce failure. The present invention requires about 70% more cycles to produce failure when compared with the prior art composition. This corresponds to a 65° F. temperature advantage over the prior art composition.

The final important material property is corrosion resistance. In this respect the present invention material has substantially identical performance to that of the prior art composition. Some relative corrosion data is found in Table IV.

Accordingly, the invention composition and particularly the preferred embodiment discussed above, has an advantage of 60°–70° F. over the prior art composition, the prior art composition which was acknowledged to have the best overall combination of properties, in all respects except hot corrosion resistance in which measurement the invention alloy is the equivalent of the prior art material. Alloy B49 represents a particularly preferred composition. Preferably no intentional additions of C, B and Zr are made and most preferably these elements are present in a maximum of 200 ppm C, 30 ppm B, and 75 ppm Zr.

It should be understood that the invention is not limited to the particular embodiments shown and described herein, but that various changes and modifications may be made without departing from the spirit and scope of this novel concept as defined by the following claims.

We claim:

1. A high strength, heat treatable, stable nickel base superalloy composition particularly suited for fabrication of single crystal articles, consisting essentially of
   3–12% Cr, 0–3% Mo, 3–10% W, 0–5% Re, 6–12% Ta, 4–7% Al, 0–15% Co, 0–0.02% B, 0–0.1% Zr, 0–0.045% C, 0–0.8% Hf, 0–2% Nb, 0–1% V, 0–0.7% Ti, 0–10% (Ru+Rh+Pd+Os+Ir+Pt), 0–0.1% Y, La, Sc, Ce, lanthanide or actinide series, balance Ni;
   said composition characterized in that where
   $-200$ Cr$+80$ Mo$-20$ Mo$^2-250$ Ti$^2-50$(Ti$\times$Ta)$+15$ Cb$+200$ W$-14$ W$^2+30$ Ta$-1.5$ Ta$^2+2.5$ Co$+1200$ Al$-100$ Al$^2+100$ Re$+1000$ Hf$-2000$ Hf$^2+700$ Hf$^3-2000$ V$-500$ C$-15000$ B$-500$ Zr$=P$ (where all elemental values are in weight percent), P is from about 3360 to about 4850.

2. A composition as in claim 1 in which the value of P is from about 3475 to about 4750.

3. A composition as in claim 1 in which the value of P is from about 3650 to about 4600.

4. A composition as in claim 1 having a composition consisting essentially of
   3–8% Cr, 0.3–3.0% Mo, 3–8% W, 0–5.0% Re, 6–12% Ta, 4.5–6.5% Al, 6–12% Co, 0–0.005% B, 0–0.007% Zr, 0–0.02% C, 0–0.5% Hf, 0–0.4% Ti, 0–10% (Ru+Ir+Pt+Pd+Rh+Os), 0–0.1% Y, La, Ce, Sc, lanthanide or actinide series, balance Ni, and a value of P (as defined in claim 1) from about 3450 to about 4750.

5. A composition as in claim 1 having a composition consisting essentially of
   4.0–7.5% Cr, 0.5–2.5% Mo, 3.5–7.5% W, 2.5–4% Re, 8–10% Ta, 5–6% Al, 8–12% Co, 0–0.3% Hf, 0–10% (Ru+Ir+Pt+Pd+Rh+Os), 0.005–0.05% Y, balance Ni, and a value of P as defined in claim 1 from about 3550 to about 4700.

6. A composition as in claim 5 having a value of P from about 3800 to about 4400.

7. A nickel base superalloy composition, suited for fabrication into a high strength single crystal article, consisting essentially of
   4.0–7.5% Cr, 8–12% Co, 0.05–2.5% Mo, 3.5–7.5% W, 2.5–4.0% Re, 0–0.04% Ti, 5–6% Al, 8–10% Ta, 0–0.3% Hf, 0–10% of an element selected from the group consisting of Pt, Pd, Os, Rh, Ru, Ir and mixtures thereof, 0–0.005% B, 0–0.007% Zr, 0–0.02% C, 0–0.01% Y, La, Ce, Sc, lanthanide or actinide series, balance essentially Ni;
   said composition characterized in that where
   $-200$ Cr$+80$ Mo$-20$ Mo$^2-250$ Ti$^2-50$(Ti$\times$Ta)$+15$ Cb$+200$ W$-14$ W$^2+30$ Ta$-1.5$ Ta$^2+2.5$ Co$+1200$ Al$-100$ Al$^2+100$ Re$+1000$ Hf$-2000$ Hf$^2+700$ Hf$^3-2000$ V$-500$ C$-15000$ B$-500$ Zr$=P$ (where all elemental values are in weight percent), P is from about 3650 to about 4550.

8. A composition as in claim 7 which is free from intentional additions of C, B and Zr.

9. A nickel base superalloy single crystal article consisting essentially of
   3–12% Cr, 0–3% Mo, 3–10% W, 0–5% Re, 6–12% Ta, 4–7% Al, 0–15% Co, 0–0.02% B, 0–0.1% Zr, 0–0.045% C, 0–0.8% Hf, 0–2% Nb, 0–1% V, 0–0.7% Ti, 0–10% (Ru+Rh+Pd+Os+Ir+Pt), 0–0.1% Y, La, Sc, Ce, lanthanide or actinide series, balance Ni;
   said composition characterized in that where
   $P=-200$ Cr$+80$ Mo$-20$ Mo$^2-250$ Ti$^2-50$ (Ti$\times$Ta)$+15$ Cb$+200$ W$-14$ W$^2+30$ Ta$-1.5$ Ta$^2+2.5$ Co$+1200$ Al$-100$ Al$^2+100$ Re$+1000$ Hf$-2000$ Hf$^2+700$ Hf$^3-2000$ V$-500$ C$-15000$ B$-500$ Zr, P is from about 3360 to about 4850.

10. A single crystal article as in claim 9 having a composition consisting essentially of
    3–8% Cr, 0.3–3.0% Mo, 3–8% W, 0–5.0% Re, 6–12% Ta, 4.5–6.5% Al, 6–12% Co, 0–0.005% B, 0–0.007% Zr, 0–0.02% C, 0–0.5% Hf, 0–0.4% Ti, 0–10% (Ru+Ir+Pt+Pd+Rh+Os), 0–0.1% Y, La, Sc, Ce, lanthanide or actinide series, balance Ni, and a value of P from about 3450 to about 4750.

11. A single crystal article as in claim 10 having a composition consisting essentially of
    4.0–7.5% Cr, 0.5–2.5% Mo, 3.5–7.5% W, 2.5–4% Re, 8–10% Ta, 5–6% Al, 8–12% Co, 0–0.3% Hf, 0–10% (Ru+Ir+Pt+Pd+Rh+Os), 0.005–0.05 Y, balance Ni, and a value of P from about 3550 to 4700.

12. An article as in claim 9 in which the value of P lies between about 3650 and about 4600.

13. An article as in claim 10 in which the value of P lies between about 3550 and about 4650.

14. An article as in claim 10 in which the value of P lies between about 3700 and about 4500.

15. An article as in claim 11 in which the value of P lies between about 3650 and about 4550.

16. An article as in claim 11 in which the value of P lies between about 3800 and about 4400.

* * * * *